United States Patent
Wang et al.

(10) Patent No.: US 11,677,057 B2
(45) Date of Patent: Jun. 13, 2023

(54) LIGHT EMITTING DEVICE, LIGHT EMITTING MODULE, AND ILLUMINATING APPARATUS

(71) Applicant: EPISTAR CORPORATION, Hsinchu (TW)

(72) Inventors: Tzu-Hsiang Wang, Taoyuan (TW); Chi-Chih Pu, Taoyuan (TW); Chen-Hong Lee, Taoyuan (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 17/107,391

(22) Filed: Nov. 30, 2020

(65) Prior Publication Data

US 2021/0083162 A1  Mar. 18, 2021

Related U.S. Application Data

(63) Continuation of application No. 14/731,419, filed on Jun. 5, 2015, now Pat. No. 10,854,800.

(60) Provisional application No. 62/034,164, filed on Aug. 7, 2014.

(51) Int. Cl.
*H01L 33/62* (2010.01)
*F21K 9/232* (2016.01)
*F21Y 115/10* (2016.01)
*F21Y 107/00* (2016.01)

(52) U.S. Cl.
CPC .............. *H01L 33/62* (2013.01); *F21K 9/232* (2016.08); *F21Y 2107/00* (2016.08); *F21Y 2115/10* (2016.08)

(58) Field of Classification Search
CPC .................................. F21K 9/232; H01L 33/62
See application file for complete search history.

(56) References Cited

U.S. PATENT DOCUMENTS

| | | | |
|---|---|---|---|
| 9,261,242 B2 | 2/2016 | Ge et al. | |
| 9,366,390 B2 | 6/2016 | Kuo et al. | |
| 2004/0008525 A1* | 1/2004 | Shibata | F21K 9/232 362/240 |
| 2007/0139949 A1 | 6/2007 | Tanda et al. | |

(Continued)

FOREIGN PATENT DOCUMENTS

| | | |
|---|---|---|
| CN | 101782189 A | 7/2010 |
| CN | 101994959 A | 3/2011 |

(Continued)

*Primary Examiner* — Zheng Song
(74) *Attorney, Agent, or Firm* — Ditthavong, Steiner & Mlotkowski

(57) ABSTRACT

A light emitting device includes a substrate, a first group of light emitting diode (LED) structures, a second group of LED structures, and a connection port is provided. The substrate has a first surface and a second surface opposite to the first surface. The first group of LED structures is disposed on one side of the first surface. The second group of LED structures is disposed on another side of the first surface opposite to the first group of LED structures. The connection portion includes at least an opening, and a first connection pad and a second connection pad electrically coupled to at least a part of the LED structures. The connection port is adapted to be coupled to other device through the opening. A light emitting module and an illuminating apparatus are also provided.

7 Claims, 9 Drawing Sheets

(56) References Cited

U.S. PATENT DOCUMENTS

| | | |
|---|---|---|
| 2009/0108271 A1 | 4/2009 | Chou et al. |
| 2010/0053956 A1 | 3/2010 | Park et al. |
| 2010/0320928 A1 | 12/2010 | Kaihotsu et al. |
| 2011/0050071 A1 | 3/2011 | Chung et al. |
| 2011/0163683 A1 | 7/2011 | Steele et al. |
| 2011/0303927 A1 | 12/2011 | Sanpei et al. |
| 2012/0044669 A1 | 2/2012 | Ogata et al. |
| 2013/0044480 A1 | 2/2013 | Sato et al. |
| 2013/0058080 A1* | 3/2013 | Ge .................. F21K 9/232 362/231 |
| 2013/0155683 A1* | 6/2013 | Matsuda ............ F21K 9/232 362/249.02 |
| 2013/0188375 A1 | 7/2013 | Masuda et al. |
| 2013/0235592 A1* | 9/2013 | Takeuchi ........... F21V 23/001 362/363 |
| 2013/0235593 A1 | 9/2013 | Takeuchi et al. |
| 2013/0249381 A1* | 9/2013 | Takeuchi ........... H05B 33/02 313/292 |
| 2014/0197440 A1 | 7/2014 | Ye et al. |
| 2014/0240979 A1* | 8/2014 | Chen ................. F21V 13/08 362/296.05 |
| 2014/0254181 A1 | 9/2014 | Chang et al. |
| 2014/0362565 A1 | 12/2014 | Yao et al. |
| 2015/0069432 A1 | 3/2015 | Chiu |
| 2015/0103526 A1 | 4/2015 | Johnson et al. |
| 2016/0155775 A1* | 6/2016 | Yano ................. H01L 33/505 257/89 |

FOREIGN PATENT DOCUMENTS

| | | |
|---|---|---|
| CN | 202992879 U | 6/2013 |
| CN | 103456728 A | 12/2013 |
| CN | 203521459 U | 4/2014 |
| CN | 103867947 A | 6/2014 |
| TW | M485346 U | 9/2014 |

* cited by examiner

LIGHT EMITTING DEVICE, LIGHT EMITTING MODULE, AND ILLUMINATING APPARATUS

CROSS-REFERENCE TO RELATED APPLICATIONS

This application claims the priority benefit of U.S. application Ser. No. 14/731,419, filed on Jun. 5, 2015, now U.S. Pat. No. 10,854,800, which claims the priority benefit of U.S. Provisional Application No. 62/034,164, filed on Aug. 7, 2014, which are incorporated herein by reference in their entirety.

BACKGROUND OF THE INVENTION

1. Field of the Invention

The invention generally relates to a light emitting device, a light emitting module, and an illuminating apparatus.

2. Description of Related Art

Light emitting diodes (LEDs) are semiconductor devices. LEDs emit light by converting electric energy into light energy. In details, LEDs apply currents to compound semiconductors so as to release excess energy in the form of light through the binding of electrons and holes. Since the light emitting phenomenon of LEDs does not occur through thermo-luminescence or discharge-luminescence, the lifespan of LEDs can be longer than one hundred thousand hours. LEDs further include advantages such as fast response speed, small volume, energy saving, low pollution, high reliability, suitable for mass production, and so on. Thus, LEDs can be widely applied in various fields, for instance, large display boards, traffic lights, cellular phones, scanner, light sources of fax machines, LED lamps, and the like.

A general lamp filament adopting LEDs has the electrodes disposed at two opposite ends of the lamp filament, wherein the electrodes are configured to be electrically connected to an external electrical power. Since the electrodes are disposed at the two opposite ends, the lamp filament is hard to be assembled. Usually, the lamp filament needs to be manually assembled. As a result, the yield of the assembled lamp filaments is low, the process time is long, and the lamp filament is unfavorable to mass production.

SUMMARY OF THE INVENTION

Accordingly, the invention is directed to a light emitting device, which is easy to be assembled.

The invention is directed to a light emitting module, which is easy to be assembled.

The invention is directed to an illuminating apparatus, which is easy to be assembled.

According to an embodiment of the invention, a light emitting device including a substrate, a first group of light emitting diode (LED) structures, a second group of LED structures, and a connection port is provided. The substrate has a first surface and a second surface opposite to the first surface. The first group of LED structures is disposed on one side of the first surface. The second group of LED structures is disposed on another side of the first surface opposite to the first group of LED structures. The connection port is adapted to be directly coupled to other device. The connection portion includes a top opening, a side opening, and a first connection pad and a second connection pad electrically coupled to at least a part of the first group and the second group of LED structures. The connection pads are disposed on the substrate and between the first group of LED structures and the second group of LED structures, and the top opening directly exposes the connection pads and communicates with the side opening located on a side of the connection port. At least a part of light emitted from the first group and the second group of LED structures passes through the substrate and emerges from the second surface, and the light emitting device emits light in omni-directions.

According to an embodiment of the invention, a light emitting module including the aforementioned light emitting device and a connection device is provided. The connection device includes a bonding surface. The light emitting device is engaged with the connection device through the top and side openings of the connection port of the light emitting device, and the connection pads of the connection port are bonded on the bonding surface of the connection device.

According to an embodiment of the invention, a light emitting module including at least two aforementioned light emitting devices and a connection device is provided. The connection device includes a bonding surface, wherein the light emitting devices are coupled to each other, and at least one of the light emitting devices is disposed on the bonding surface of the connection device.

According to an embodiment of the invention, an illuminating apparatus including a lamp holder, the aforementioned light emitting module, and a lamp cap is provided. The lamp cap is disposed on the lamp holder. The lamp cap and the lamp holder define an accommodating space, wherein the light emitting module is disposed in the accommodating space.

In the light emitting device, the light emitting module, and the illuminating apparatus according to the embodiments of the invention, the connection port is between the first group of LED structures and the second group of LED structures, so that the light emitting device is easy to be assembled through the connection port. In this way, the light emitting device may be automatically assembled by a machine, so that the mass production and high yield may be achieved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
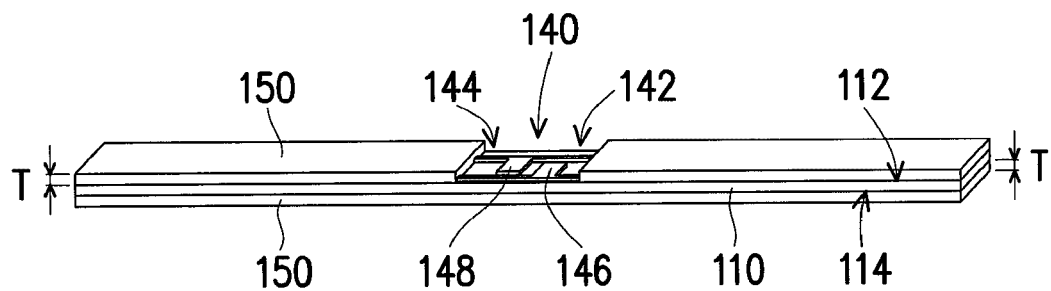
FIG. 1A is a schematic perspective view of a light emitting device according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

Figure 1B:
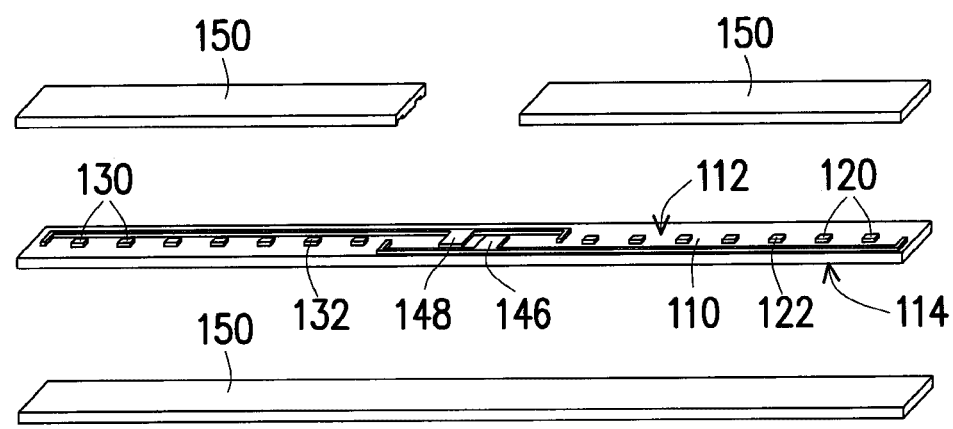
FIG. 1B is a schematic exploded view of the light emitting device in FIG. 1A.
Figure 1C:
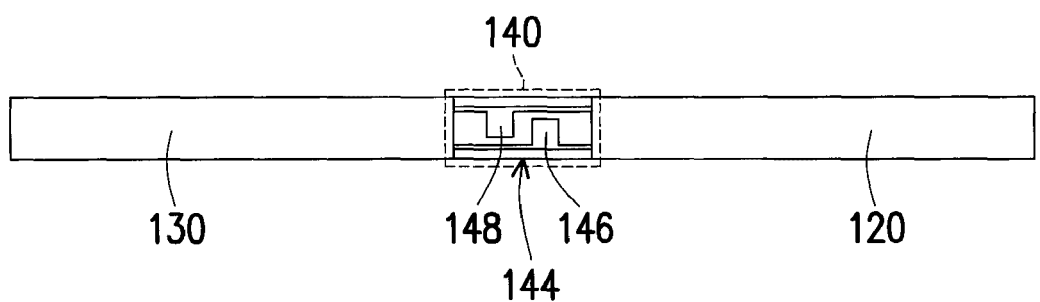
FIG. 1C is a schematic top view of the first group of LED structures, the second group of LED structures, and the connection port in FIG. 1A.

FIG. 1 A is a schematic perspective view of a light emitting device according to an embodiment of the invention, FIG. 1B is a schematic exploded view of the light emitting device in FIG. 1A, and FIG. 1C is a schematic top view of the first group of LED structures, the second group of LED structures, and the connection port in FIG. 1A. Referring to FIGS. 1A to 1C, the light emitting device 100 in this embodiment includes a substrate 110, a first group of light emitting diode (LED) structures 120, a second group of LED structures 130, and a connection port 140. The substrate 110 has a first surface 112 and a second surface 114 opposite to the first surface 112. The first group of LED structures 120 is disposed on one side of the first surface 112. The second group of LED structures 130 is disposed on another side of the first surface 112 opposite to the first group of LED structures 120. The connection port 140 adapted to directly coupled to other device is disposed on the first surface 112 of the substrate 110 and includes a top opening 142, a side opening 144, a first connection pad 146 and a second connection pad 148. The first and second connection pads 146 and 148 are electrically coupled to at least a part of the first group and the second group of LED structures 120 and 130. The first and second connection pads 146 and 148 are disposed on the substrate 110 and between the first group of LED structures 120 and the second group of LED structures 130, and the top opening 142 directly exposes the first and second connection pads 146 and 148 and communicates with the side opening 144 located on a side of the connection port 140. At least a part of light emitted from the LED structures 120 or 130 can pass through the substrate 110 and emerge from the second surface 114, so that the light emitting device 100 can emit light in at least two opposite directions, preferably in omni-directions.

In this embodiment, the LED structures may be connected in series or in parallel in the first group or the second group of LED structures 120/130, and the first connection pad 146 and the second connection pad 148 are respectively electrically connected to at least two electrodes of the first group of LED structures 120 and at least two electrodes of the second group of LED structures 130. The electrical property of the first connection pad 146 is different from the electrical property of the second connection pad 148. For example, one of the first connection pad 146 and the second connection pad 148 is a positive electrode pad, and the other of the first connection pad 146 and the second connection pad 148 is a negative electrode pad.

In this embodiment, the light emitting device 100 further includes a wavelength conversion layer 150. The wavelength conversion layer 150 is disposed on the substrate 110 for receiving at least a part of light emitted from the first and second groups of LED structures 120 and 130, and exposes the connection port 140 to form the top and side openings 142 and 144. In this embodiment, the thickness T of the wavelength conversion layer 150 is preferably greater than 30 μm. Furthermore, the wavelength conversion layer 150 is disposed on at least a part of the first surface 112 of the substrate 110 and covers the first and second groups of LED structures 120 and 130. A part of the wavelength conversion layer 150 which covers the first group of LED structures 120 and another part of the wavelength conversion layer 150 which covers the second group of LED structures 130 may respectively include the same or different phosphor compositions, which means, for example, the material, element, concentration or distribution of the phosphor in the wavelength conversion layers 150 disposed on different positions may be the same or different, so that the lighting effects, like color, brightness or intensity, induced by the first group of LED structures 120 and the second group of LED structures 130 may be the same or different. Besides, a wavelength conversion layer 150 could be disposed on the second surface 114 of the substrate 110.

In this embodiment, the shape of the first surface 112 is rectangular, and each of the first group and the second group of the LED structures 120 and 130 is arranged along a direction parallel to a side of the first surface 112. The quantity of the LED structures 122 in the first group of LED structures 120 could be the same as or different from the quantity of the LED structures 132 in the second group of LED structures 130. The color of light emitted from the first group of LED structures 120 could be the same 10 as or different from the color of light emitted from the second group of LED structures 130. The intensity of light emitted from the first group of LED structures 120 could be the same as or different from the intensity of light emitted from the second group of LED structures 130.

In this embodiment, the light emitting device 100 may serve as a lamp filament. In the light emitting device 100, the connection port 140 is between the first group of LED structures 120 and the second group of LED structures 130, so that the light emitting device 100 is easy to be assembled through the opening of the connection port 140. In this way, the light emitting device 100 may be automatically assembled by a machine, so that the mass production and high yield may be achieved. In addition, the light emitting device 100 has an upper wavelength conversion layer 150 and a lower wavelength conversion layer 150, so that the color temperature of the light emitting device 100 may be flexibly adjusted by adjusting the coefficients of the upper wavelength conversion layer 150 and the lower wavelength conversion layer 150, so as to mix the color temperature due to the upper wavelength conversion layer 150 and the color temperature due to the lower wavelength conversion layer 150 to form the color temperature of the light emitting device 100.

Figure 2:
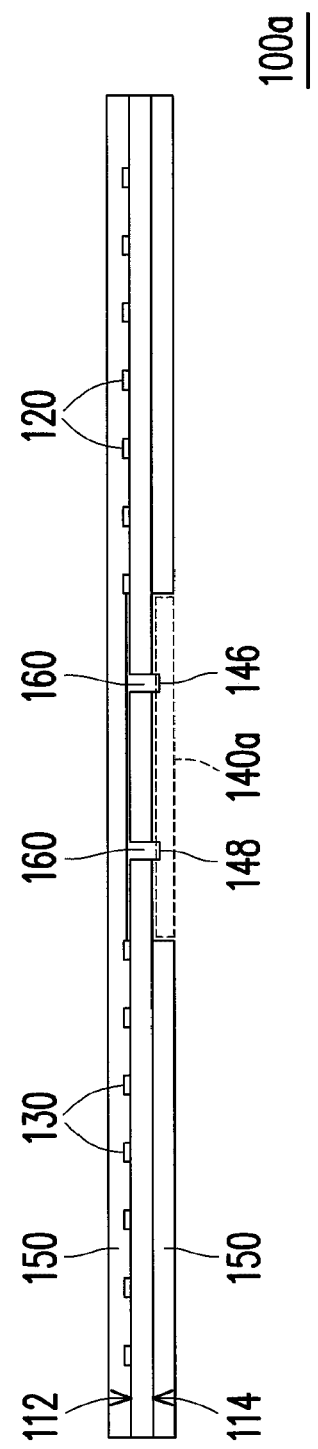
FIG. 2 is a cross-sectional view of a light emitting device according to an embodiment of the invention.

FIG. 2 is a cross-sectional view of a light emitting device according to an embodiment of the invention. Referring to FIG. 2, the light emitting device 100a in this embodiment is similar to the light emitting device 100 in FIG. 1A, and the main difference therebetween is as follows. In this embodiment, the connection port 140a is disposed on the second surface 114 of the substrate 110, and the connection port 140a further includes conductive vias 160 penetrating the substrate 110 so that the first and 10 second connection pads 146 and 148 can be respectively electrically connected to the first group and the second group of LED structures 120 and 130. The wavelength conversion layer 150 could be disposed on the second surface 114 of the substrate 110.

Figure 3:
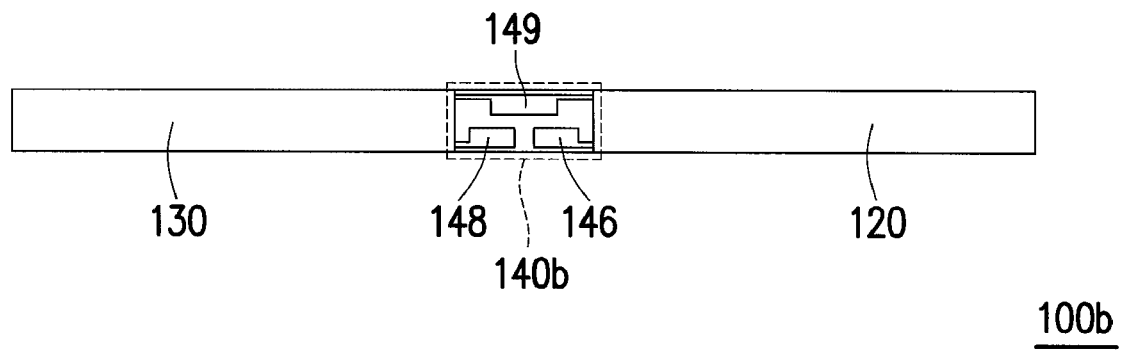
FIG. 3 is a schematic top view of a light emitting device according to an embodiment of the invention.

FIG. 3 is a schematic top view of a light emitting device according to an embodiment of the invention. Referring to FIG. 3, the light emitting device 100b in this embodiment is similar to the light emitting device 100 in FIG. 1A, and the main difference therebetween is as follows. In this embodiment, the first connection pad 146 is electrically connected to at least an electrode of the first group of LED structures 120 and the second connection pad 148 is electrically connected to at least an electrode of the second group of LED structures 130, and the connection port 140b further includes a common connection pad 149 disposed on the substrate 110 and electrically connected to electrodes with the same electrical property of the first group and the second group of LED structures 120 and 130. The electrical property of the common connection pad 149 is different from the electrical property of the first connection pad 146 and the second connection pad 148. The electrical property of the first connection pad 146 is the same as the electrical property of the second connection pad 148. Accordingly, the driving conditions for the LED structures 120 and 130 may be increased, and the lighting effect of the light emitting device 100b induced by the first group of LED structures 120 and the second group of LED structures 130 may be further adjusted for different applications according to the present invention.

Figure 4:
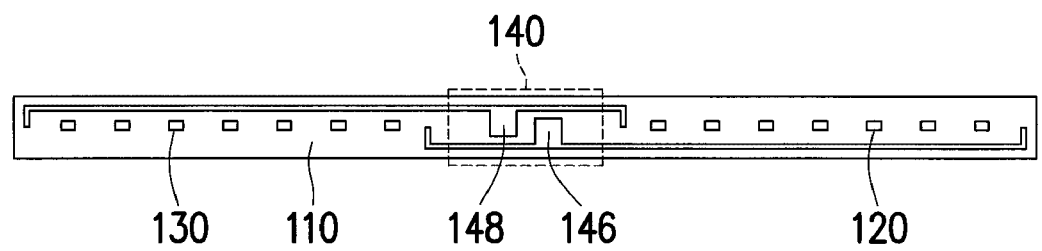
FIG. 4 is a schematic top view of a light emitting device according to another embodiment of the invention.

FIG. 4 is a schematic top view of a light emitting device according to another embodiment of the invention. Referring to FIG. 4, the light emitting device 100c in this embodiment is similar to the light emitting device 100 in FIG. 1A, and the main difference therebetween is that the light emitting device 100c does not have the wavelength conversion layer 150.

Figure 5A:
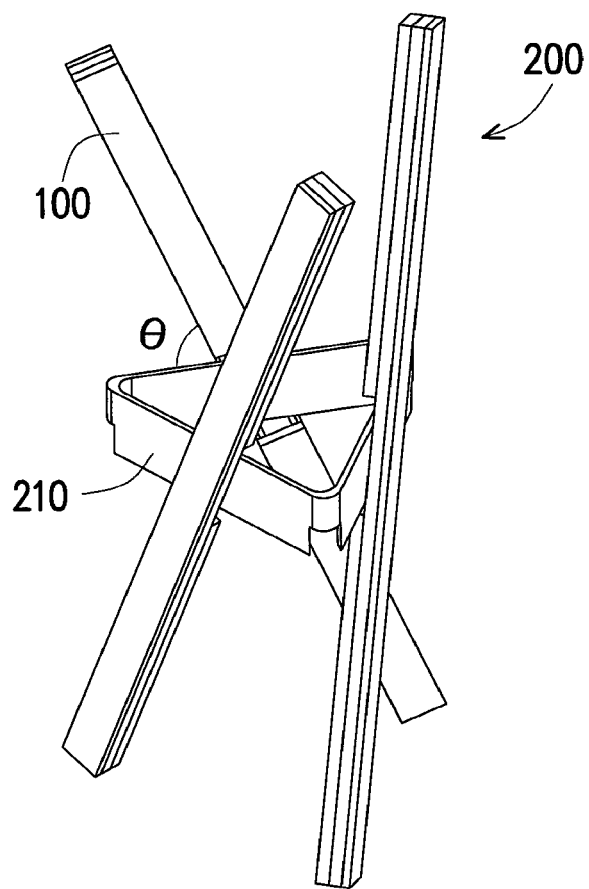
FIG. 5A is a schematic perspective view of a light emitting module according to an embodiment of the invention.
Figure 5B:
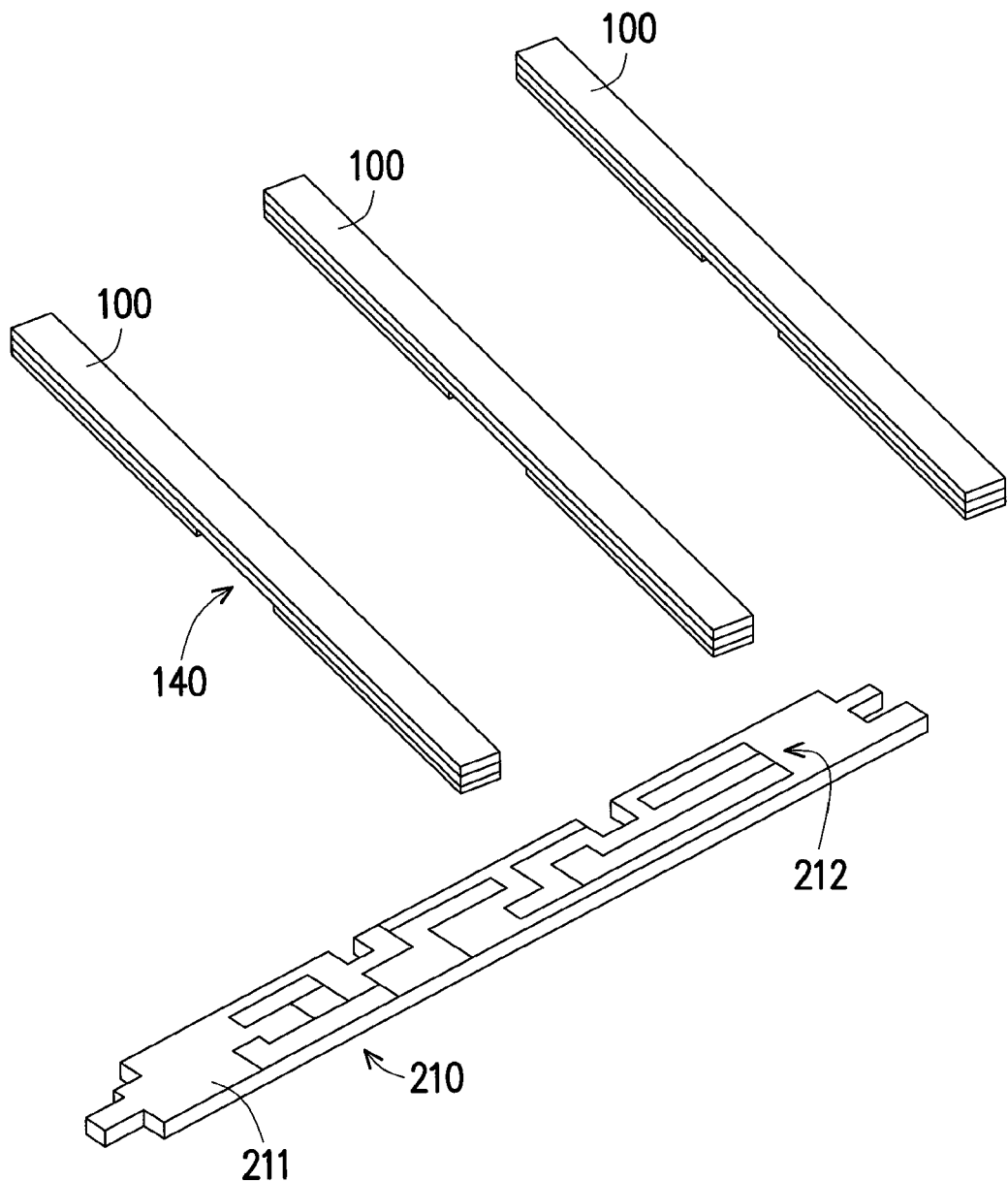
FIG. 5B is a schematic exploded view of the connection device and the light emitting device in FIG. 5A.
Figure 5C:
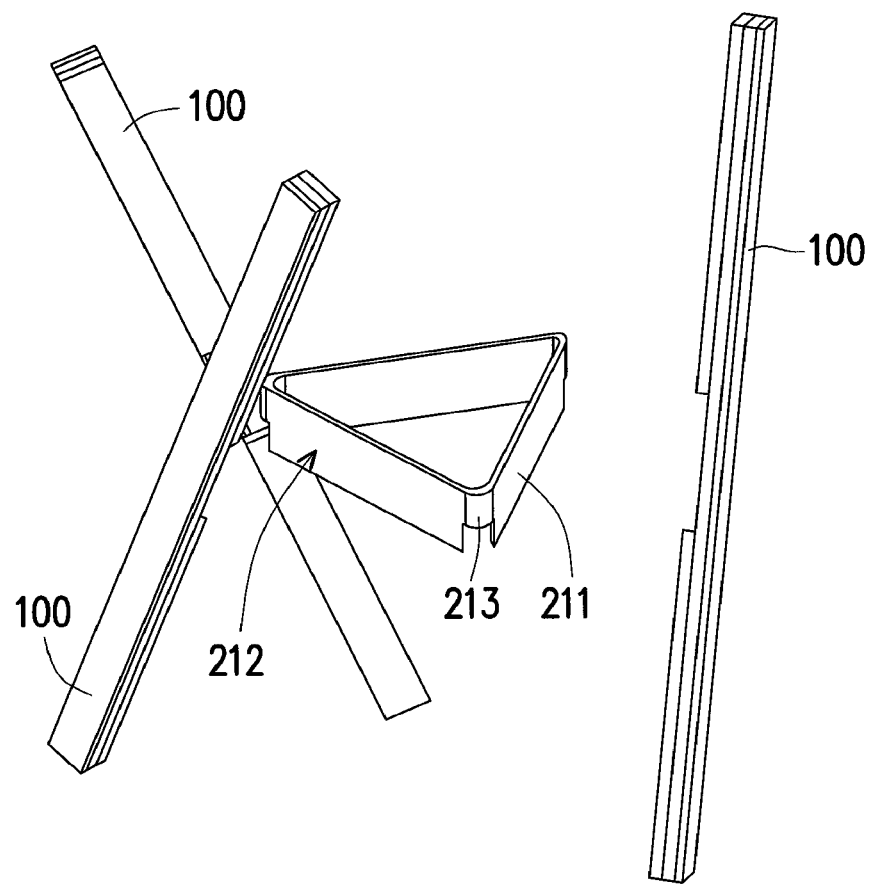
FIG. 5C is a schematic exploded view of the light emitting module in FIG. 5A.

FIG. 5A is a schematic perspective view of a light emitting module according to an embodiment of the invention, FIG. 5B is a schematic exploded view of the connection device and the light emitting device in FIG. 5A, and FIG. 5C is a schematic exploded view of the light emitting module in FIG. 5A. Referring to FIGS. 1A, and 5A to 5C, the light emitting module 200 in this embodiment includes a light emitting device 100, 100a, 100b, or 100c (e.g. 100) mentioned in any of above embodiments and a connection device 210. The connection device 210 includes a bonding surface 212. The light emitting device 100 is engaged with the connection device 210 through the top or side openings 142 and 144 of the connection port 140 of the light emitting device 100, and the first and second connection pads 146 and 148 of the connection port 140 may be bonded on the bonding surface 212 of the connection device 210 by a surface-mount technology.

In this embodiment, the quantity of the light emitting device 100 is more than one, and the connection device 210 includes a plurality of segments 211 having bonding surfaces 212 to engage with the light emitting devices 100, respectively. The light emitting devices 100 are engaged with the connection device 210 as a plurality of crosses, and an angle Θ is formed between each light emitting device 100 and the connection device 210. The angles Θ between the light emitting devices 100 and the connection device 210 could be the same or different. The degree of angles Θ could be equal to or less than 90 degree. The light emitting devices 100 could be engaged with the connection device 210 and extend along the same direction or respectively extend along a plurality of different directions.

In this embodiment, the connection device 210 is formed as a ring by connecting the segments 211 end to end. The quantity of the segments 211 could be three, and the connection device 210 is formed as a polygon-ring. The connection device 210 further includes folding junctions 213 between every two adjacent segments 211, so that the connection device 210 is foldable.

Figure 6:
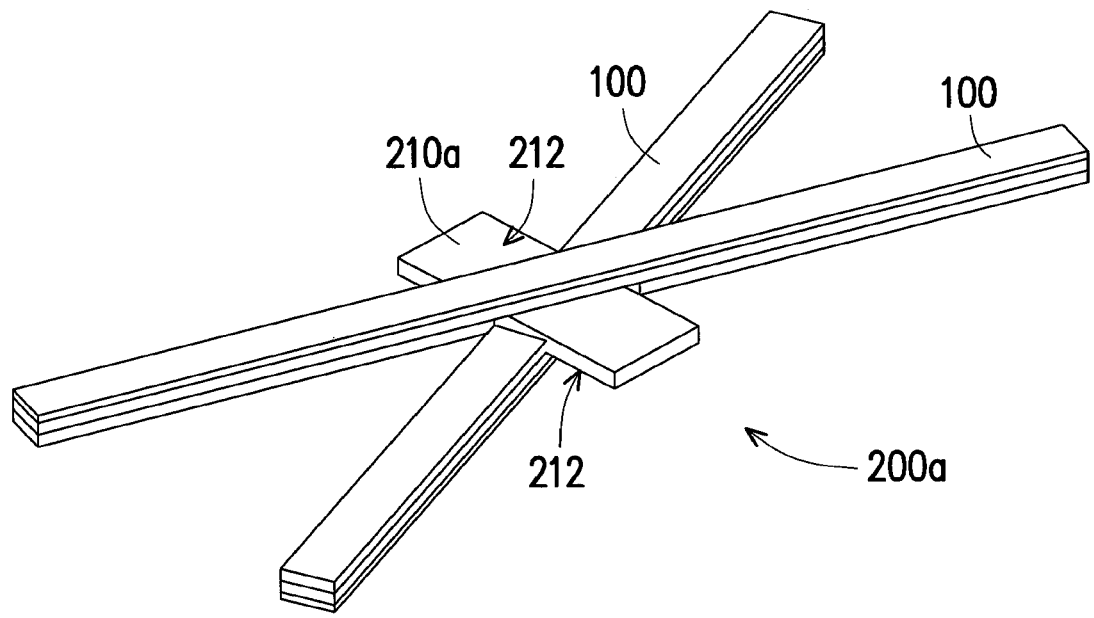
FIG. 6 is a schematic perspective view of a light emitting module according to another embodiment of the invention.

FIG. 6 is a schematic perspective view of a light emitting module according to another embodiment of the invention. Referring to FIGS. 1A and 6, the light emitting module 200a in this embodiment is similar to the light emitting module 200 in FIG. 5A, and the main difference is as follows. In this embodiment, the light emitting module 200a includes at least two light emitting device 100, 100a, 100b, 100c (e.g. 100) mentioned in any of above embodiments and a connection device 210a. The connection device 210a includes a bonding surface 212. The light emitting devices 100 are coupled to each other, and at least one of the light emitting devices 100 is disposed on the bonding surface 212 of the connection device 210a. The light emitting devices 100 are engaged together through the top or side openings 142 and 144 of the connection port 140 of the light emitting device 100.

In this embodiment, the connection device 210a includes another bonding surface 212, and the light emitting devices 100 are respectively disposed on the bonding surfaces 212 opposite to each other, so that the light emitting devices 100 can be coupled to each other. The light emitting devices 100 could be engaged with the connection device 210a and extend along the same direction or respectively extend along a plurality of different directions.

Figure 7A:
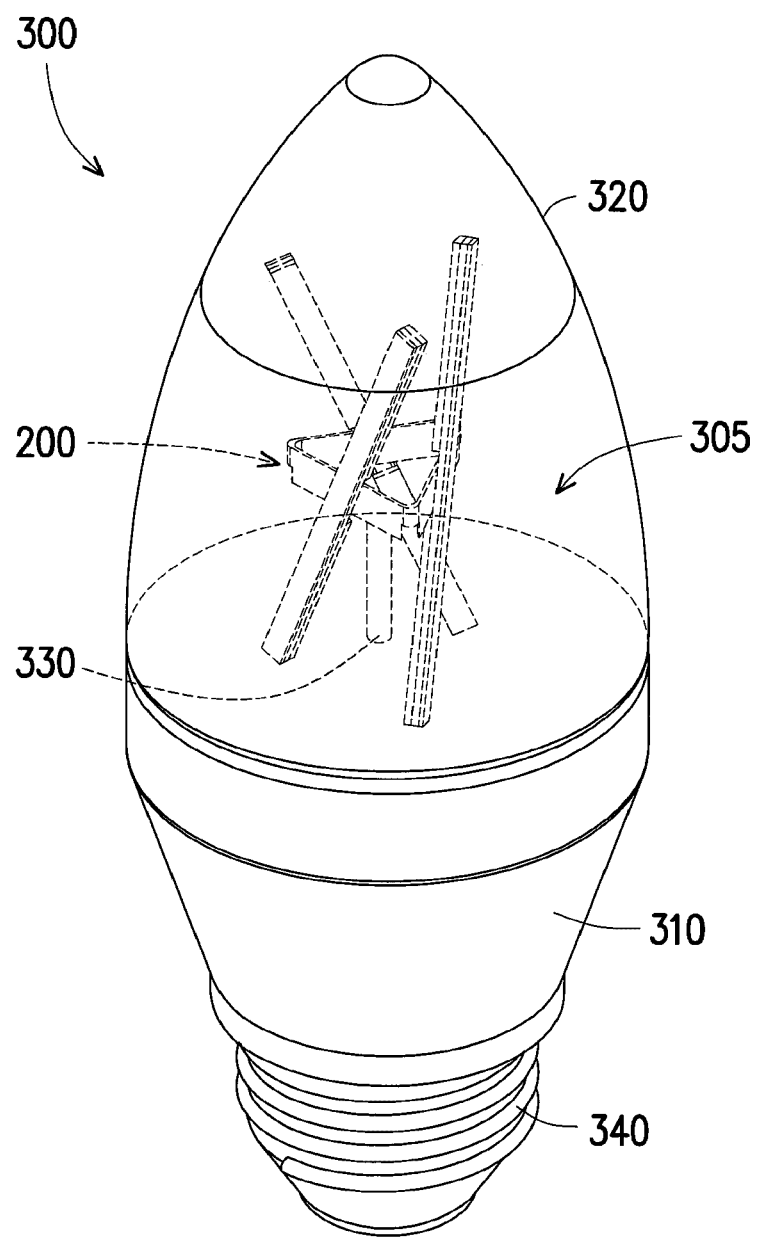
FIG. 7A is a schematic perspective view of an illuminating apparatus according to an embodiment of the invention.
Figure 7B:
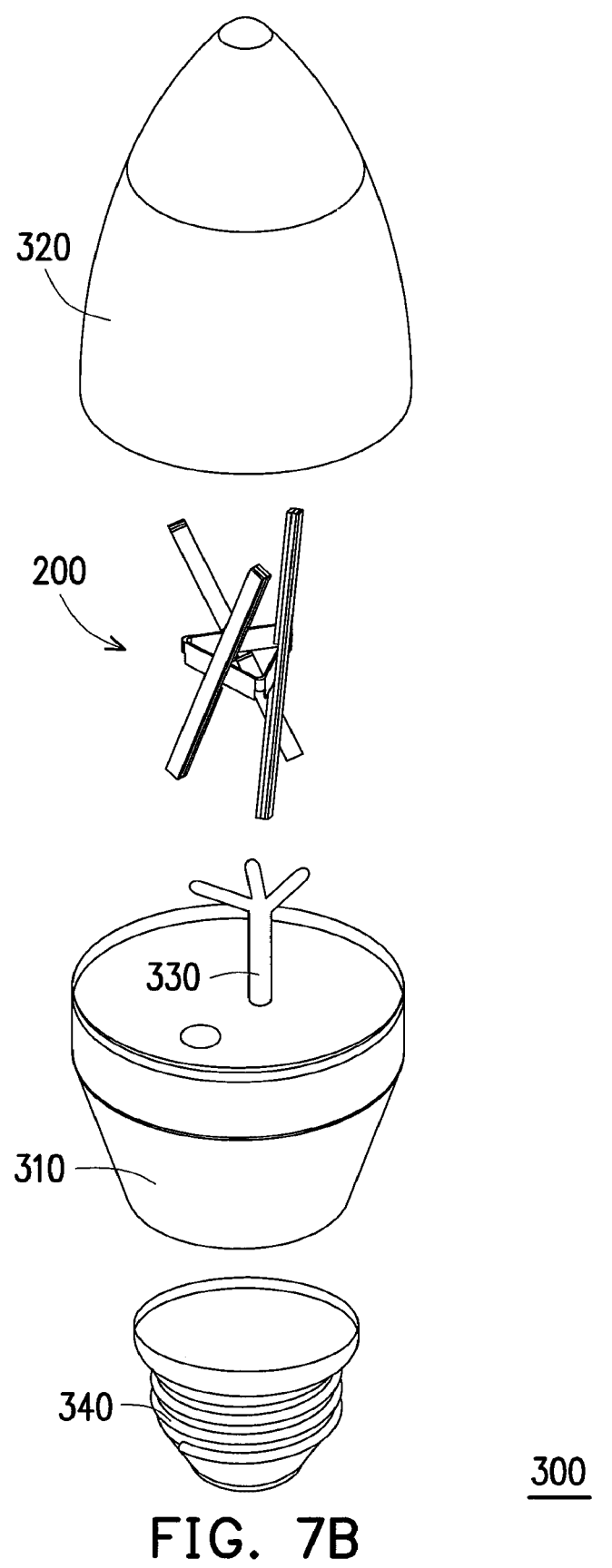
FIG. 7B is a schematic exploded view of the illuminating apparatus in FIG. 7A.

FIG. 7A is a schematic perspective view of an illuminating apparatus according to an embodiment of the invention, and FIG. 7B is a schematic exploded view of the illuminating apparatus in FIG. 7A. Referring to FIGS. 5A, 7A and 7B, the illuminating apparatus 300 in this embodiment includes a lamp holder 310, a lamp connector 340, a bracket 330, a light emitting module 200 or 200a (e.g. 200) mentioned in any of above embodiments, and a lamp cap 320. The light emitting module 200 is disposed on the lamp holder 310. The lamp cap 320 is disposed on the lamp holder 310. The lamp cap 320 and the lamp holder 310 define an accommodating space 305, wherein the light emitting module 200 is disposed in the accommodating space 305. The bracket 330 is disposed between the light emitting module 200 and the lamp holder 310, wherein the bracket 330 is connected to the connection device 210 to bear the light emitting module 200. The lamp connector 340 is disposed under the lamp holder 310 and electrically connects the light emitting module 200 and an external electrical power.

In conclusion, in the light emitting device, the light emitting module, and the illuminating apparatus according to the embodiments of the invention, the connection port is between the first group of LED structures and the second group of LED structures, so that the light emitting device is easy to be assembled through the connection port. In this way, the light emitting device may be automatically assembled by a machine, so that the mass production and high yield may be achieved.

It will be apparent to those skilled in the art that various modifications and variations can be made to the structure of the invention without departing from the scope or spirit of the invention. In view of the foregoing, it is intended that the invention covers modifications and variations of this invention provided they fall within the scope of the following claims and their equivalents.

What is claimed is:

1. A light-emitting apparatus, comprising:
   a lamp holder;

a first light-emitting module, arranged on the lamp holder, and comprising:
  a first substrate, having a first longer edge with a first extending direction, a first surface, and a second surface opposite to the first surface;
  a first group of light-emitting diode structures, disposed on the first surface; and
  a first connection port;
a second light-emitting module, arranged on the lamp holder, and comprising:
  a second substrate, having a second longer edge with a second extending direction, a third surface, and a fourth surface opposite to the third surface;
  a second group of light-emitting diode structures, disposed on the third surface; and
  a second connection port;
a first connecting device, connected to the first connection port;
a second connecting device, connected to the second connection port;
a lamp cap, arranged on the lamp holder, defining an accommodating space with the lamp holder, and the first light-emitting module and the second light-emitting module arranged in the accommodating space; and
a bracket, arranged on the lamp holder and having a third extending direction;
wherein the first light-emitting module and the bracket are connected through the first connecting device, and the second light-emitting module and the bracket are connected through the second connecting device;
wherein, in a projection plane, the first extending direction and the third extending direction has a first included angle, the second extending direction and the third extending direction has a second included angle;
wherein the first included angle and the second included angle are different, and the first included angle and the second included angle are equal to or less than 90 degrees;
wherein the first connection port is arranged on the second surface of the first substrate, and comprises a plurality of conductive vias penetrating the first substrate, and a first connecting pad and a second connecting pad which are electrically connected to the first group of light-emitting diode structures through the plurality of conductive vias; and
wherein the first connecting pad and the second connecting pad have a same electrical polarity.

2. The light-emitting apparatus of claim 1, wherein the first light-emitting module further comprises a common connecting pad arranged on the first substrate, and the common connecting pad and the first connecting pad have different electrical polarities.

3. The light-emitting apparatus of claim 1, wherein the first substrate is transparent to light from the first light-emitting module.

4. The light-emitting apparatus of claim 1, wherein the first light emitting module further comprises a third group of light-emitting diode structures arranged on the first surface; and a wavelength converting layer covering the first group of light-emitting diode structures and the third group of light-emitting diode structures; wherein the wavelength converting layer has portions with different phosphor compositions, the portions respectively correspond to the first group of light-emitting diode structures and the third group of light-emitting diode structures.

5. The light emitting apparatus of claim 1, wherein the first light-emitting module is arranged to engage with the first connecting device through the first connection port, and the first connection port comprises a first connecting pad and a second connecting pad which are bonded to the first connecting device.

6. The light-emitting apparatus of claim 1, wherein each of the first light-emitting module and the second light-emitting module is configured to emit light in omni-directions.

7. The light-emitting apparatus of claim 1, wherein the first light-emitting module further comprises a third group of light-emitting diode structures arranged on the first surface, and the first group of light-emitting diode structures and the third group of light-emitting diode structures are configured to emit different color lights.

* * * * *